(12) United States Patent
Yoshizumi et al.

(10) Patent No.: US 8,486,731 B2
(45) Date of Patent: Jul. 16, 2013

(54) LIGHT-EMITTING DEVICE AND METHOD FOR MANUFACTURING LIGHT-EMITTING DEVICE

(75) Inventors: Nobuyuki Yoshizumi, Osaka (JP); Shinji Yamaguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 57 days.

(21) Appl. No.: 13/207,752

(22) Filed: Aug. 11, 2011

(65) Prior Publication Data
US 2012/0049222 A1   Mar. 1, 2012

(30) Foreign Application Priority Data

Aug. 25, 2010  (JP) .................................. 2010-188164

(51) Int. Cl.
*H01L 21/00*   (2006.01)
*H01L 33/00*   (2010.01)

(52) U.S. Cl.
USPC ............. 438/25; 438/27; 438/116; 257/98; 257/100; 257/432; 257/E33.059; 257/E33.061

(58) Field of Classification Search
None
See application file for complete search history.

(56) References Cited

U.S. PATENT DOCUMENTS

| | | | | |
|---|---|---|---|---|
| 5,282,922 A | * | 2/1994 | Reche | 438/623 |
| 5,959,316 A | * | 9/1999 | Lowery | 257/98 |
| 7,622,747 B2 | * | 11/2009 | Taguchi et al. | 257/98 |
| 2006/0186431 A1 | | 8/2006 | Miki et al. | |
| 2007/0158674 A1 | | 7/2007 | Taguchi et al. | |
| 2007/0194676 A1 | | 8/2007 | Tanda et al. | |
| 2009/0231833 A1 | | 9/2009 | Miki et al. | |
| 2011/0228517 A1 | | 9/2011 | Kawabat et al. | |

FOREIGN PATENT DOCUMENTS

| | | |
|---|---|---|
| JP | 10-294498 | 11/1998 |
| JP | 2006-229055 A | 8/2006 |
| JP | 2006-294925 A | 10/2006 |
| JP | 2007-184425 A | 7/2007 |
| JP | 2007-194287 | 8/2007 |
| JP | 2007-221048 A | 8/2007 |
| JP | 2009-158655 A | 7/2009 |
| JP | 2010-073755 A | 4/2010 |
| JP | 2010-129953 A | 6/2010 |

* cited by examiner

*Primary Examiner* — Alonzo Chambliss
(74) *Attorney, Agent, or Firm* — Nixon & Vanderhye P.C.

(57) ABSTRACT

A light-emitting device includes: a substrate; a light-emitting section provided on an upper surface of the substrate, the light-emitting section including an LED chip and a sealing resin containing fluorescent material covering the LED chip; and a silicon oxide insulating film provided between the substrate and the light-emitting section, the silicon oxide insulating film being formed directly on an upper surface of the substrate or an alumina insulating film, the sealing resin containing fluorescent material formed directly on an upper surface of the silicon oxide insulating film so as to cover the LED chip. Thus, this invention provides the light-emitting device capable of making the sealing resin difficult to be separated from the substrate and a method for manufacturing the light-emitting device.

4 Claims, 7 Drawing Sheets

LIGHT-EMITTING DEVICE AND METHOD FOR MANUFACTURING LIGHT-EMITTING DEVICE

This Nonprovisional application claims priority under 35 U.S.C. §119(a) on Patent Application No. 2010-188164 filed in Japan on Aug. 25, 2010, the entire contents of which are hereby incorporated by reference.

TECHNICAL FIELD

The present invention relates to a light-emitting device including a light-emitting element (semiconductor light-emitting element) which is provided on a substrate and is covered with a sealing resin and a method for manufacturing the light-emitting device, and more particularly, relates to a technique for making a sealing resin difficult to be separated from a substrate.

BACKGROUND ART

A light emitting diode (LED), whose efficiency has been improved in recent years, has been widely used in a backlight of a display device and lighting equipment as a light source capable of saving more power than a light bulb or a fluorescent. Various light-emitting devices including light-emitting elements such as the LEDs have been proposed so far. In particular, a light-emitting device including a light-emitting element which is provided on a substrate and is sealed by a resin containing fluorescent material (fluorescent particles) is known.

In such a light-emitting device, short wavelength light emitted from the light-emitting element is excited by a fluorescent material, to thereby cause occurrence of secondary light. Then, the light from the light-emitting element and light from the fluorescent material are combined together, and hence the aforementioned light-emitting device can emit light of predetermined chromaticity. For example, the light-emitting device can emit white light by combining a blue light-emitting element and a yellow fluorescent material. Specifically, blue light emitted from the blue light-emitting element is converted into yellow light by the yellow fluorescent material, and then the yellow light thus converted and blue light are combined together, to thereby emit white light.

As a method for forming a sealing resin, a compression molding using a mold can be employed (see, e.g., Patent Literature 1), for example. However, during the compression molding, viscosity of a liquid resin containing fluorescent material is often reduced when a temperature is raised in order to cure the liquid resin containing fluorescent material. When the viscosity of the liquid resin is reduced, the fluorescent material in the liquid resin may be sedimented by gravity. Consequently, the fluorescent material may gather into a bottom of a concave of a lower mold, in other words, may gather into a top of the sealing resin of a finished light-emitting device. Gathering of the fluorescent material into the top of the sealing resin means that the fluorescent material is away from the light-emitting element, resulting in reduction in wavelength conversion efficiency of the fluorescent material. Therefore, a large amount of fluorescent material needs to be added, but this is not preferable in terms of cost.

Further, light emitted upwardly with respect to the light-emitting element passes through the fluorescent material, so that an emission wavelength spectrum is increased. Meanwhile, light emitted laterally with respect to the light-emitting element does not pass through the fluorescent material, so that an emission wavelength spectrum of the light emitted laterally is similar to an emission wavelength spectrum of the light-emitting element. Because of this, the light-emitting device sometimes has different emission wavelength spectra, i.e., different colors depending on the directions along which light is emitted.

For this reason, in the case of forming the sealing resin by the compression molding, a resultant sealing resin is sometimes inappropriate for the light-emitting device. The fluorescent material would not be sedimented if the mold is rotated so that the gravity is applied to the resin on the side of the light-emitting element and substrate. However, this causes a lot of problems, for example, complication of a molding machine.

In view of this, in order to (i) solve the problem of the sedimentation of the fluorescent material and to (ii) reduce the cost as much as possible in response to a demand for reduction in the total cost, a sealing method without using the compression molding, which uses the mold, has been also proposed. The sealing method without using the compression molding is as follows: a dam sheet (retaining member) having a through hole capable of accommodating a light-emitting element is attached to a surface of a substrate on which surface the light-emitting element is mounted, and then a liquid resin containing fluorescent material is injected into the through hole and thermally cured.

According to this sealing method, the sealing resin can be formed by retaining the liquid resin containing fluorescent material within the through hole with use of the dam sheet. Further, the fluorescent material is sedimented on the side of a light-emitting element even if the fluorescent material in the resin is sedimented by the gravity during the thermal curing. Consequently, the fluorescent material covers the light-emitting element, with the result that change in the emission wavelength spectrum, in other words, change in color caused by a direction is prevented.

However, in the aforementioned sealing method, the dam sheet is thrown away every time when sealing is finished. Therefore, this sealing method disadvantageously highly costs. In view of this, such a method has been proposed that uses a water-repellent film instead of the dam sheet.

For example, a method for forming a sealing layer is disclosed in Patent Literature 2 as follows: on a planar substrate having a plurality of light-emitting elements, ring-shaped frames made of a water-repellent liquid resin (for example, fluororesin) are formed so that the ring-shaped frames surround an area in which the sealing layer is formed; then, a liquid transparent resin (for example, silicone resin or epoxy resin) is injected into the ring-shaped frames and is thermally cured. The ring-shaped frames as the water-repellent films prevent the liquid resin from extending beyond the ring-shaped frames. Ultimately, the liquid resins having the same thickness can be held within the ring-shaped frames, and the sealing layer having a target dimension can be obtained.

Meanwhile, a greater improvement in luminous efficacy has been demanded in recent years. In order to meet the demand, there has been proposed a light-emitting device having a dual seal structure in which a resin containing fluorescent material for sealing a light-emitting element on a substrate is covered with a transparent resin in order to improve a luminous efficacy. In order to manufacture the light-emitting device having the aforementioned structure with use of the water-repellent film, the resin containing fluorescent material is formed so as to seal the light-emitting element with use of the water-repellent film as described above, and then the transparent resin is formed so as to cover the resin containing fluorescent material.

CITATION LIST

[Patent Literature]
[Patent Literature 1]
Japanese Patent Application Publication, Tokukai, No. 2007-194287 A (Publication Date: Aug. 2, 2007)
[Patent Literature 2]
Japanese Patent Application Publication, Tokukaihei, No. 10-294498 A (Publication Date: Nov. 4, 1998)

SUMMARY OF INVENTION

Technical Problem

However, in the light-emitting device made by using a conventional sealing method, the sealing resin is disadvantageously apt to be separated from the substrate when external stress applies to the sealing resin. For example, a demand for thinning of, particularly, large-size display devices has been increased in recent years. In response to this, the display device tends to be made thinner. Therefore, the sealing resin of the light-emitting device is brought into contact with a housing of the display device when the light-emitting device is built into the display device. This may cause the separation of the sealing resin at an interface between the substrate and the sealing resin. If the sealing resin is separated at the interface between the substrate and the sealing resin, a wire for electrically connecting a wiring pattern of the substrate with the light-emitting element is disconnected in the worst case, resulting in a bad connection.

Meanwhile, with the dual seal structure in which the light-emitting element on the substrate is sealed with the resin containing fluorescent material and the transparent resin, if the resin containing fluorescent material is formed with use of the water-repellent film, the transparent resin is formed on the water-repellent film. However, the transparent resin is very likely to be separated from the substrate when external stress applies to the transparent resin because the transparent resin has low adhesiveness with respect to the water-repellent film.

The present invention has been made in view of the conventional problems described above. It is an object of the present invention to provide a light-emitting device in which a sealing resin is hardly separated from a substrate and a method for manufacturing the light-emitting device.

Solution to Problem

In order to attain the aforementioned object, a light-emitting device of the present invention includes: a substrate; at least one light-emitting section provided on an upper surface of the substrate, the at least one light-emitting section including at least one light-emitting element, and a first sealing resin covering the at least one light-emitting element; and a silicon oxide insulating film provided between the substrate and the at least one light-emitting section, the silicon oxide insulating film being directly formed on at least an area of the upper surface of the substrate in which area the at least one light-emitting section is provided, the first sealing resin being formed directly on an upper surface of the silicon oxide insulating film so as to cover the at least one light-emitting element.

With this structure, the first sealing resin is formed directly on the silicon oxide insulating film which is formed directly on the substrate. Therefore, as compared with adhesive strength between the first sealing resin and the substrate in the case of forming the first sealing resin directly on the substrate as in a conventional product, each of (i) adhesive strength between the substrate and the silicon oxide insulating film and (ii) adhesive strength between the silicon oxide insulating film and the first sealing resin is higher. This makes it possible to enhance adhesiveness of the first sealing resin with respect to the substrate. Accordingly, the first sealing resin is hardly separated even if external stress is applied to the first sealing resin.

Further, a light-emitting device of the present invention includes: a substrate; at least one light-emitting section provided on an upper surface of the substrate, the at least one light-emitting section including at least one light-emitting element, and a first sealing resin covering the at least one light-emitting element; an alumina insulating film provided between the substrate and the at least one light-emitting section; and a silicon oxide insulating film provided between the substrate and the at least one light-emitting section, the alumina insulating film being formed directly on a whole area of the upper surface of the substrate, the silicon oxide insulating film being formed directly on at least an area of an upper surface of the alumina insulating film in which area the at least one light-emitting section is provided, the first sealing resin being formed directly on an upper surface of the silicon oxide insulating film so as to cover the at least one light-emitting element.

With this structure, the first sealing resin is formed directly on the silicon oxide insulating film, and the silicon oxide insulating film is formed directly on the alumina insulating film which is formed directly on the substrate. As compared with adhesive strength between the first sealing resin and the substrate in the case of directly forming the first sealing resin on the substrate as in a conventional product, each of (i) adhesive strength between the substrate and the alumina insulating film, (ii) adhesive strength between the alumina insulating film and the silicon oxide insulating film, and (iii) adhesive strength between the silicon oxide insulating film and the first sealing resin is higher. This makes it possible to enhance the adhesiveness of the first sealing resin with respect to the substrate. Accordingly, the first sealing resin is hardly separated even if external stress is applied to the first sealing resin.

In order to attain the object, a method for manufacturing the light-emitting device of the present invention including a substrate and at least one light-emitting section provided on an upper surface of the substrate, the at least one light-emitting section including at least one light-emitting element and a first sealing resin covering the at least one light-emitting element, said method comprising the steps of: forming a silicon oxide insulating film directly on at least an area of the upper surface of the substrate in which area the at least one light-emitting section is to be provided, the upper surface having a wiring pattern; forming a water-repellent film on the upper surface of the substrate so as to cover the silicon oxide insulating film; forming an opening in the water-repellent film, for exposing, through the opening, the silicon oxide insulating film formed on the area in which the at least one light-emitting section is to be provided; providing the at least one light-emitting element on the silicon oxide insulating film within the opening; and forming the first sealing resin by injecting a liquid resin into the opening so as to cover the at least one light-emitting element and curing the liquid resin.

With this arrangement, injecting the liquid resin into the opening allows the liquid resin to be formed into a hemispherical shape in a self-aligned manner by the action of surface tension of the resin, so that the light-emitting element can be covered with the resin. Further, if a temperature is raised during the curing of the liquid resin, the viscosity of the resin is reduced and the resin itself tends to extend. However, the resin is repelled by the water-repellent film, and therefore the first resin having the hemispherical shape can be formed.

Further, the first sealing resin is formed directly on the silicon oxide insulating film which is formed directly on the substrate. Therefore, as compared with adhesive strength between the first sealing resin and the substrate in the case of forming the first sealing resin directly on the substrate as in a conventional product, each of (i) adhesive strength between the substrate and the silicon oxide insulating film and (ii) adhesive strength between the silicon oxide insulating film and the first sealing resin is higher. This makes it possible to enhance adhesiveness of the first sealing resin with respect to the substrate. Accordingly, the first sealing resin is hardly separated even if external stress is applied to the first sealing resin.

Further, a method for manufacturing a light-emitting device including a substrate and at least one light-emitting section provided on an upper surface of the substrate, the at least one light-emitting section including at least one light-emitting element and a first sealing resin covering the at least one light-emitting element, said method includes the steps of: forming an alumina insulating film directly on a whole area of the upper surface of the substrate, the upper surface having a wiring pattern; forming a silicon oxide insulating film directly on at least an area of an upper surface of the alumina insulating film in which area the at least one light-emitting section is to be provided; forming a water-repellent film on the upper surface of the alumina insulating film so as to cover the silicon oxide insulating film; forming an opening in the water-repellent film, for exposing, through the opening, the silicon oxide insulating film formed on the area in which the at least one light-emitting section is to be provided; providing the at least one light-emitting element on the silicon oxide insulating film within the opening; and forming the first sealing resin by injecting a liquid resin into the opening so as to cover the at least one light-emitting element and curing the liquid resin.

With this arrangement, injecting the liquid resin into the opening allows the liquid resin to be formed into a hemispherical shape in a self-aligned manner by the action of surface tension of the resin, so that the light-emitting element can be covered with the resin. Further, if a temperature is raised during the curing of the liquid resin, the viscosity of the resin is reduced and the resin itself tends to extend. However, the resin is repelled by the water-repellent film, and therefore the first resin having the hemispherical shape can be formed. Furthermore, the alumina insulating film is formed on the substrate. This makes it possible to prevent reduction in water-repellency of the water-repellent film which reduction is caused by effects of the surface state and the material of the substrate.

Further, with this structure, the first sealing resin is formed directly on the silicon oxide insulating film, and the silicon oxide insulating film is formed directly on the alumina insulating film which is formed directly on the substrate. As compared with adhesive strength between the first sealing resin and the substrate in the case of directly forming the first sealing resin on the substrate as in a conventional product, each of (i) adhesive strength between the substrate and the alumina insulating film, (ii) adhesive strength between the alumina insulating film and the silicon oxide insulating film, and (iii) adhesive strength between the silicon oxide insulating film and the first sealing resin is higher. This makes it possible to enhance the adhesiveness of the first sealing resin with respect to the substrate. Accordingly, the first sealing resin is hardly separated even if external stress is applied to the first sealing resin.

Advantageous Effects of Invention

As described above, a light-emitting device of the present invention includes a silicon oxide insulating film provided between a substrate and at least one light-emitting section, the silicon oxide insulating film being directly formed on at least an area of an upper surface of the substrate in which area the at least one light-emitting section is provided, a first sealing resin being formed directly on an upper surface of the silicon oxide insulating film so as to cover at least one light-emitting element.

A method for manufacturing the light-emitting device of the present invention includes the steps of: forming a silicon oxide insulating film directly on at least an area of the upper surface of the substrate in which area the at least one light-emitting section is to be provided, the upper surface having a wiring pattern; forming a water-repellent film on the upper surface of the substrate so as to cover the silicon oxide insulating film; forming an opening in the water-repellent film, for exposing, through the opening, the silicon oxide insulating film formed on the area in which the at least one light-emitting section is to be provided; providing the at least one light-emitting element on the silicon oxide insulating film within the opening; and forming the first sealing resin by injecting a liquid resin into the opening so as to cover the at least one light-emitting element and curing the liquid resin.

Hence, the first sealing resin is formed directly on the silicon oxide insulating film which is formed directly on the substrate. This can enhance the adhesiveness of the first sealing resin with respect to the substrate. Accordingly, the first sealing resin is hardly separated even if external stress is applied to the first sealing resin.

Further, a light-emitting device of the present invention includes: an alumina insulating film provided between the substrate and the at least one light-emitting section; and a silicon oxide insulating film provided between the substrate and the at least one light-emitting section, the alumina insulating film being formed directly on a whole area of the upper surface of the substrate, the silicon oxide insulating film being formed directly on at least an area of an upper surface of the alumina insulating film in which area the at least one light-emitting section is provided, the first sealing resin being formed directly on an upper surface of the silicon oxide insulating film so as to cover the at least one light-emitting element.

A method for manufacturing the light-emitting device of the present invention includes: the steps of: forming an alumina insulating film directly on a whole area of the upper surface of the substrate, the upper surface having a wiring pattern; forming a silicon oxide insulating film directly on at least an area of an upper surface of the alumina insulating film in which area the at least one light-emitting section is to be provided; forming a water-repellent film on the upper surface of the alumina insulating film so as to cover the silicon oxide insulating film; forming an opening in the water-repellent film, for exposing, through the opening, the silicon oxide insulating film formed on the area in which the at least one light-emitting section is to be provided; providing the at least one light-emitting element on the silicon oxide insulating film within the opening; and forming the first sealing resin by injecting a liquid resin into the opening so as to cover the at least one light-emitting element and curing the liquid resin.

Hence, the first sealing resin is formed directly on the silicon oxide insulating film, and the silicon oxide insulating film is formed directly on the alumina insulating film which is formed directly on the substrate. This can enhance the adhesiveness of the first sealing resin with respect to the substrate. Accordingly, the first sealing resin is hardly separated even if external stress is applied to the first sealing resin.

BRIEF DESCRIPTION OF DRAWINGS

FIG. 1 is a sectional view of an embodiment of a light-emitting device according to the present invention.

FIG. 2 is a plan view of the light-emitting device of FIG. 1.

FIG. 3 is a flow chart of a manufacturing process of the light-emitting device of FIG. 1.

FIG. 4 is a sectional view showing (i) a step of the manufacturing process of the light-emitting device of FIG. 1 and (ii) a structure in which an alumina insulating film and a silicon oxide insulating film are formed.

FIG. 5 is a sectional view showing (i) a step of the manufacturing process of the light-emitting device of FIG. 1 and (ii) a structure in which a fluorine-based water-repellent film is formed.

FIG. 6 is a view showing (i) a step of the manufacturing process of the light-emitting device of FIG. 1 and (ii) a structure in which openings are formed in the fluorine-based water-repellent film.

FIG. 7 is a sectional view showing (i) a step of the manufacturing process of the light-emitting device of FIG. 1 and (ii) a structure in which LED chips are provided.

FIG. 8 is a sectional view showing (ii) a step of the manufacturing process of the light-emitting device of FIG. 1 and (ii) how a sealing resin containing fluorescent material is formed.

FIG. 9 is a view showing (i) a step of the light-emitting device of FIG. 1 and (ii) a structure in which a fluorine-based water-repellent film is removed.

FIG. 10 is a plan view of another embodiment of the light-emitting device according to the present invention.

FIG. 11 is a plan view of still another embodiment of a light-emitting device according to the present invention.

FIG. 12 is a sectional view of yet another embodiment of a light-emitting device according to the present invention.

FIG. 13 is a flow chart of a manufacturing process of the light-emitting device of FIG. 12.

FIG. 14 is a view showing (i) a step of the manufacturing process of the light-emitting device of FIG. 12 and (ii) how a light-transmitting resin dome and a light-transmitting resin layer are formed.

DESCRIPTION OF EMBODIMENTS

[Embodiment 1]

An embodiment of the present invention will be described below with reference to the drawings. In this embodiment, there will be described a light-emitting device usable as a light source of a lighting device, a display device, or the like. Note that, in the description below, upper and lower sides of FIG. 1 correspond to upper and lower sides of the light-emitting device, respectively.

Figure 1:
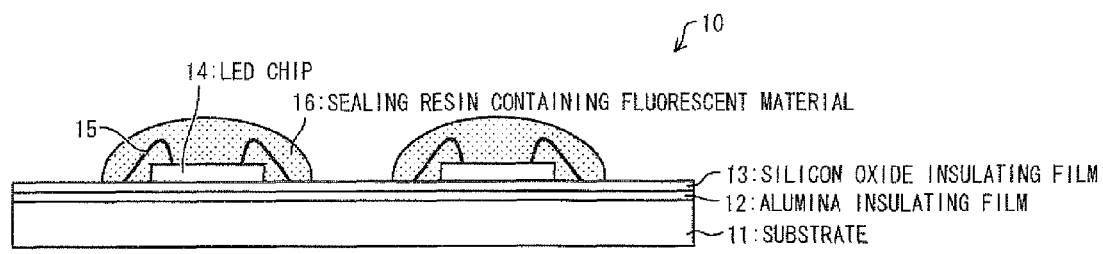
FIG. 1
Figure 2:
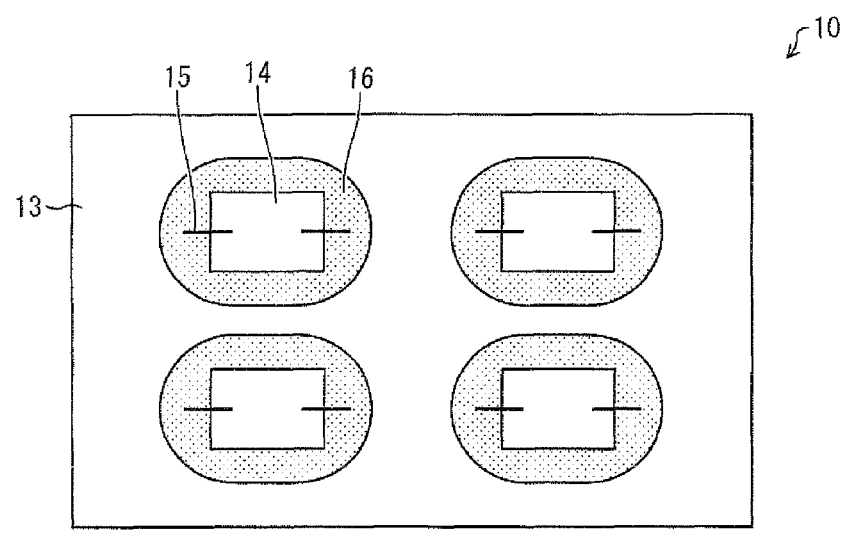
FIG. 2

FIG. 1 is a sectional view showing a structural example of a light-emitting device 10 according to this embodiment. FIG. 2 is a plan view of the light-emitting device 10. As shown in FIG. 1 and FIG. 2, the light-emitting device 10 includes a substrate 11, an alumina insulating film 12, a silicon oxide insulating film 13, LED chips (light-emitting elements) 14, and a sealing resin containing fluorescent material (first sealing resin) 16. Note that, in FIG. 2, a part of the sealing resin 16 containing fluorescent material is shown transparently in order to show the LED chips 14 clearly.

The substrate 11 is a planar substrate having a single-layer structure. The substrate 11 is preferably made of a material whose surface has a high reflecting effect, e.g., ceramic. The alumina insulating film 12, the silicon oxide insulating film 13, the LED chips 14, and the sealing resin 16 containing fluorescent material is formed on an upper surface (hereinafter, referred to as a mounting surface) of the substrate 11. Further, a wiring pattern (not shown) including electrodes is formed on the mounting surface of the substrate 11. The wiring pattern is formed on a predetermined position of the mounting surface in accordance with a mounting position of the LED chip 14. A so-called solder resist is not formed on the wiring pattern.

The alumina insulating film 12 functions as an adjusting film for preventing reduction in water-repellency of a fluorine-based water-repellent film 17 (described later), which reduction is caused by effects of a surface state and the material of the substrate 11. The fluorine-based water-repellent film 17 is formed during a manufacturing process of the light-emitting device 10. The alumina insulating film 12 only needs to be an insulating film made of a resin containing alumina as a main constituent, and is formed directly on a whole area of the mounting surface of the substrate 11.

The silicon oxide insulating film 13 enhances adhesiveness of the sealing resin 16 containing fluorescent material. The silicon oxide insulating film 13 only needs to be an insulating film made of a resin containing oxide silicon as a main constituent. For example, a silicon oxide film can be used. The silicon oxide insulating film 13 is formed directly on a whole area of an upper surface of the alumina insulating film 12.

Each of the LED chips 14 is a light-emitting diode emitting blue light having an emission peak wavelength of about 450 nm, but the present invention is not limited thereto. The plurality of LED chips 14 (four in this embodiment) are provided on the mounting surface of the substrate 11, to be exact, on the silicon oxide insulating film 13. Each LED chip 14 is electrically connected to the wiring pattern on the substrate 11 by wire bonding with use of a gold wire 15. The gold wire 15 is made of gold, for example.

The sealing resin 16 containing fluorescent material is a resin layer made of a resin containing fluorescent material. The sealing resin 16 containing fluorescent material is provided on each of the LED chips 14. The sealing resin 16 containing fluorescent material is formed so as to cover the LED chip 14 and the gold wire 15 directly connected to the LED chip 14. The sealing resin 16 containing fluorescent material is applied so as to have a hemispherical (dome-shaped) external shape.

A red fluorescent material (Sr, Ca)AlSiN$_3$:Eu and a green fluorescent material Ca$_3$(Sc, Mg)$_2$Si$_3$O$_{12}$:Ce are used as the fluorescent material. Note that the present invention is not limited thereto, and, for example, BOSE (Ba, O, Sr, Si, Eu), SOSE (Sr, Ba, Si, O, Eu), YAG (activated Ce-doped Yttrium Aluminum Garnet), αsialon ((Ca), Si, Al, O, N, Eu), or βsialon (Si, Al, O, N, Eu) can be favorably used as the fluorescent material. By considering a combination with a color of light emitted from the LED chips 14, it is possible to select a fluorescent material which allows the light-emitting device 10 to emit light having a predetermined color (chromaticity).

According to the light-emitting device 10 having the aforementioned structure, light is emitted from surfaces of respective pieces of the sealing resin 16 containing fluorescent material aforementioned. That is, in the light-emitting device 10, one LED chip 14 and the sealing resin 16 containing fluorescent material covering the LED chip 14 forms one light-emitting section, and the plurality of such light-emitting sections are provided. As shown in FIG. 2, the light-emitting sections are arranged in a matrix of two rows and two columns when seen in a plan view. However, the light-emitting sections do not need to be equally spaced, and a way of arranging the light-emitting sections is not particularly limited. Note that the light-emitting sections are preferably arranged so as to be equally spaced and to have high integration, e.g., so as to be in a matrix or in a radial pattern, in order to prevent a case where emitted light is shown as bright spots of individual light-emitting sections.

Note that the number of the light-emitting sections is determined in accordance with, for example, light intensity that is set to the light-emitting device 10. Therefore, the plurality of light-emitting sections are not always needed, and at least one light-emitting section needs to be mounted.

(Method for Manufacturing Light-Emitting Device)

A method for manufacturing the light-emitting device 10 will be described below.

Figure 3:
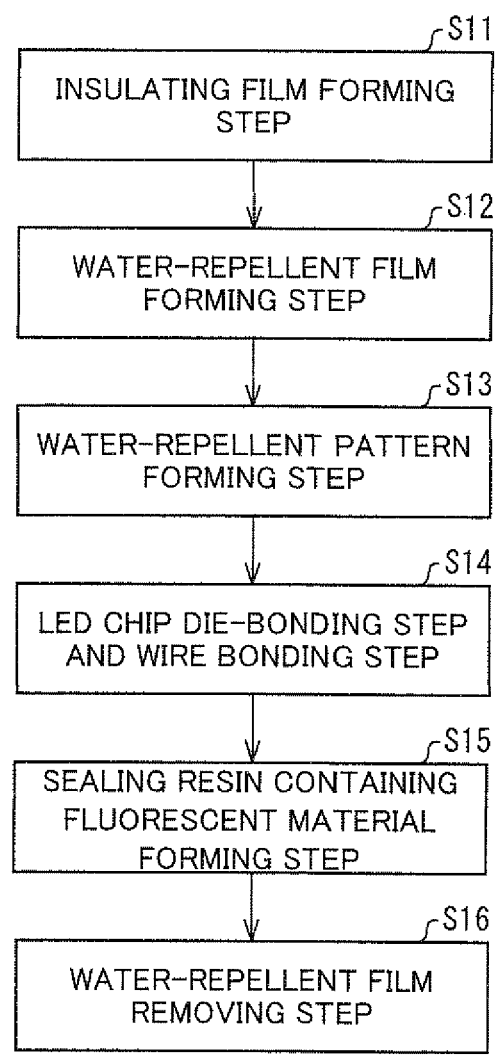
FIG. 3

FIG. 3 is a flow chart showing the manufacturing process of the light-emitting device 10. Each of FIG. 4 to FIG. 9 simply shows a step of the manufacturing process of the light-emitting device 10.

As shown in FIG. 3, the manufacturing process of the light-emitting device 10 includes an insulating film forming step (step S11), a water-repellent film forming step (step S12), a water-repellent pattern forming step (step S13), an LED chip die bonding step and a wire bonding step (step S14), a sealing resin containing fluorescent material forming step (step S15), and a water-repellent film removing step (step S16). Hereinafter, a detail description of each step will be made.

Note that a step for forming the wiring pattern on the substrate 11 is carried out before the insulating film forming step. However, description of forming the wiring pattern is herein omitted because the step for forming the wiring pattern on the substrate 11 uses a conventionally known material and method.

<Step S11: Insulating Film Forming Step>

Figure 4:
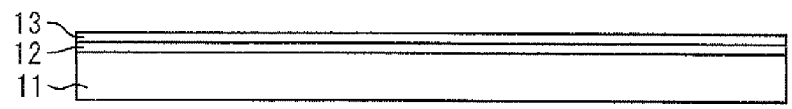
FIG. 4

First, as shown in FIG. 4, the alumina insulating film 12 and the silicon oxide insulating film 13 are formed in the stated order on the substrate 11 having the mounting surface on which the wiring pattern (not shown) is formed. Specifically, the substrate 11 having the mounting surface on which the wiring pattern is formed is placed in a chamber (not shown), and the mounting surface of the substrate 11 is subjected to cleaning and activation with oxygen plasma. Then, aluminum oxide (Al$_3$O$_2$) is heated to 100° C. and is vaporized, and the aluminum oxide (Al$_3$O$_2$) as a reactant gas is introduced into the chamber heated to 55° C. in advance. Thereafter, a pressure of 0.23 to 0.50 torr is applied to the inside of the chamber, and the alumina insulating film 12 is formed on a whole area of the mounting surface of the substrate 11 having a film thickness of Å level.

Next, the upper surface of the alumina insulating film 12 is subjected to cleaning and activation with oxygen plasma in the same chamber. A silane-based film-forming material and a catalyst (H$_2$O) are heated to 100° C. and vaporized. Then, as a reactant gas, the resultant is flown into the chamber heated to 55° C. in advance. Thereafter, a pressure of 0.23 to 0.50 torr is applied to the inside of the chamber, and the silicon oxide insulating film 13 having a film thickness of Å level is formed on a whole area of the upper surface of the alumina insulating film 12. Note that the method for forming the alumina insulating film 12 and the silicon oxide insulating film 13 is not limited thereto.

In this way, the alumina insulating film 12 and the silicon oxide insulating film 13 are laminated on the whole area of the mounting surface of the substrate 11 in the stated order from the substrate 11 side. The wiring pattern on the substrate 11 is covered with the alumina insulating film 12 and the silicon oxide insulating film 13. An optimum film thickness of the alumina insulating film 12 is, for example, 10 nm to 12 nm, and an optimum film thickness of the silicon oxide insulating film 13 is, for example, 10 nm to 12 nm.

<Step S12: Water-Repellent Film Forming Step>

Figure 5:
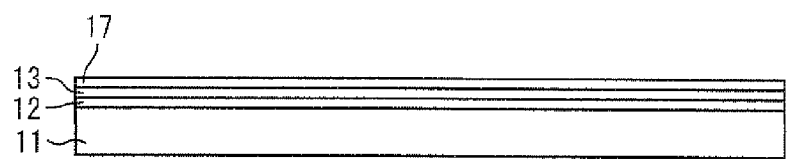
FIG. 5

Next, as shown in FIG. 5, the fluorine-based water-repellent film (water-repellent film) 17 is formed on a whole area of an upper surface of the silicon oxide insulating film 13. Specifically, the fluorine-based water-repellent film 17 (perfluorodecyltrichlorosilane (FDTS)) is formed on the whole area of the upper surface of the silicon oxide insulating film 13 by using nano-printing technology. Note that the method for forming the fluorine-based water-repellent film 17 is not limited thereto.

The fluorine-based water-repellent film 17 is laminated on the whole area of the upper surface of the silicon oxide insulating film 13 in this way. That is, the alumina insulating film 12, the silicon oxide insulating film 13, and the fluorine-based water-repellent film 17 are laminated on the whole area of the mounting surface of the substrate 11 in the stated order from the substrate 11 side. An optimum film thickness of the fluorine-based water-repellent film 17 is, for example, 1.5 nm to 2.0 nm.

<Step S13: Water-Repellent Pattern Forming Step>

Figure 6:
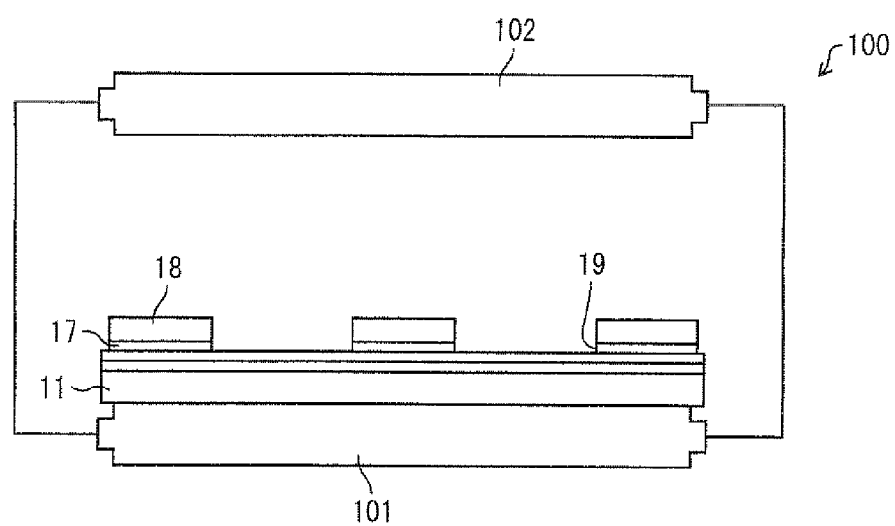
FIG. 6

Next, a water-repellent pattern is formed. In other words, as shown in FIG. 6, the fluorine-based water-repellent film 17 is patterned by a reactive ion etching (RIE) plasma device so as to form an opening 19 corresponding to an area in which the sealing resin 16 containing fluorescent material is to be provided. The water-repellent pattern is formed on the fluorine-based water-repellent film 17 in order to define an area in which the sealing resin 16 containing fluorescent material is to be formed.

Specifically, a pattern mask 18 is first placed on (is covered over) the fluorine-based water-repellent film 17. The pattern mask 18 is a base material made of stainless steel. An opening (through hole) for forming the opening 19 is formed in the pattern mask 18 in advance. Next, as shown in FIG. 6, the substrate 11 provided with the pattern mask 18 is placed in the chamber 100. The chamber 100 has a cathode electrode 101 and an anode electrode 102 which are faced to each other. The substrate 11 is placed on the cathode electrode 101. Then, etching is performed on the fluorine-based water-repellent film 17 based on the pattern mask 18 by means of the RIE. After etching, the pattern mask 18 is removed.

The fluorine-based water-repellent film 17 is partially removed in this way, i.e., the openings 19 are formed in the fluorine-based water-repellent film 17. Each of the openings 19 is formed so as to correspond to an area in which the sealing resin 16 containing fluorescent material is to be formed. A shape of the opening 19 in a top view is, for example, preferably a circle (including a rectangle with round corners, an oval, a perfect circle, or the like), but the shape thereof is not limited thereto. An external shape of the sealing resin 16 containing fluorescent material in a plan view is determined in accordance with a shape of the opening 19 in a plan view. In this embodiment, the shape of the opening 19 in a plan view is a rectangle with round corners.

<Step S14: LED Chip Die Bonding Step and Wire Bonding Step>

Figure 7:
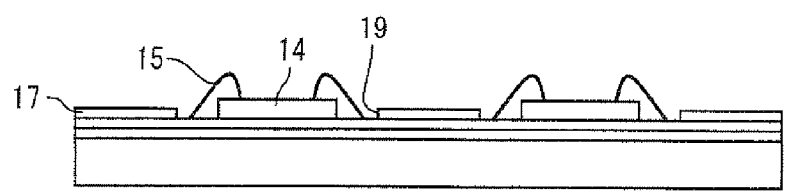
FIG. 7

Next, as shown in FIG. 7, the LED chips 14 are mounted on the substrate 11. Specifically, first, the LED chips 14 are sequentially die bonded, by an adhesive resin such as a silicone resin, on parts of the silicon oxide insulating film 13 which parts are exposed to the outside through the openings 19. In this way, each LED chip 14 is provided in a respective one of the openings 19. Thereafter, the electrodes in the wiring pattern on the substrate 11 are sequentially wire bonded to the electrodes of the LED chips 14 by the gold wires 15. Although the electrodes in the wiring pattern on the substrate 11 is covered with the alumina insulating film 12 and the silicon oxide insulating film 13 during this wire bonding, the heated gold wires 15 can penetrate through these insulating films and reach the electrodes in the wiring pattern because these insulating films are relatively thin.

<Step S15: Sealing Resin Containing Fluorescent Material Forming Step>

Figure 8:
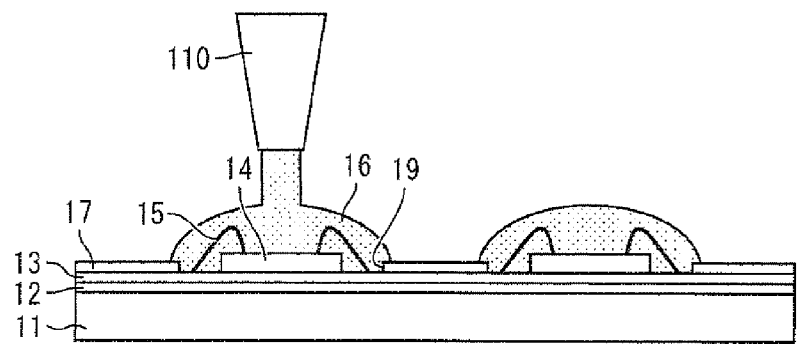
FIG. 8

Next, the sealing resin 16 containing fluorescent material is formed as shown in FIG. 8. Specifically, a liquid resin containing fluorescent material is sequentially injected into the openings 19 by a dispenser 110. The resin containing fluorescent material is a liquid silicone resin in which fluorescent material particles are dispersed. The resin containing fluorescent material is ejected from the dispenser 110 by a predetermined amount, in other words, by such an amount that the resin containing fluorescent material can cover the LED chips 14 and the gold wires 15. Injecting the liquid resin containing fluorescent material into the openings 19 allows the liquid resin containing fluorescent material to be formed into a hemispherical shape in a self-aligned manner by the action of surface tension of the resin, so that the resin containing fluorescent material can cover the LED chips 14 and the gold wires 15.

After the resin containing fluorescent material is injected into the substrate 11, the aforementioned substrate 11 is kept under the condition of temperature of 80° C. for 90 minutes, so that viscosity of the resin containing fluorescent material is reduced and the fluorescent material is sedimented. Thereafter, the resin containing fluorescent material is cured under the condition of temperature of 120° C. for 60 minutes. If the temperature is raised during curing of the resin containing fluorescent material, the viscosity of the resin containing fluorescent material is reduced and the resin itself tends to extend, but the resin is repelled by the fluorine-based water-repellent film 17. The fluorine-based water-repellent film 17 has a property that repels the liquid resin containing fluorescent material, to thereby prevent the resin containing fluorescent material injected into the openings 19 from outflowing and extending beyond the openings 19. This makes it possible to cure the resin containing fluorescent material while keeping the hemispherical shape.

In this way, the sealing resin 16 containing fluorescent material is formed on each LED chip 14 so as to cover (seal) the LED chip 14 and the gold wire 15 directly connected to the LED chip 14. Each LED chip 14 has an external shape having, for example, 400 μm (length)×250 μm (width)×30 μm (height). The sealing resin 16 containing fluorescent material is applied so as to have a dimension which covers at least the external shape of the LED chip 14.

<Step S16: Water-Repellent Film Removing Step>

Figure 9:
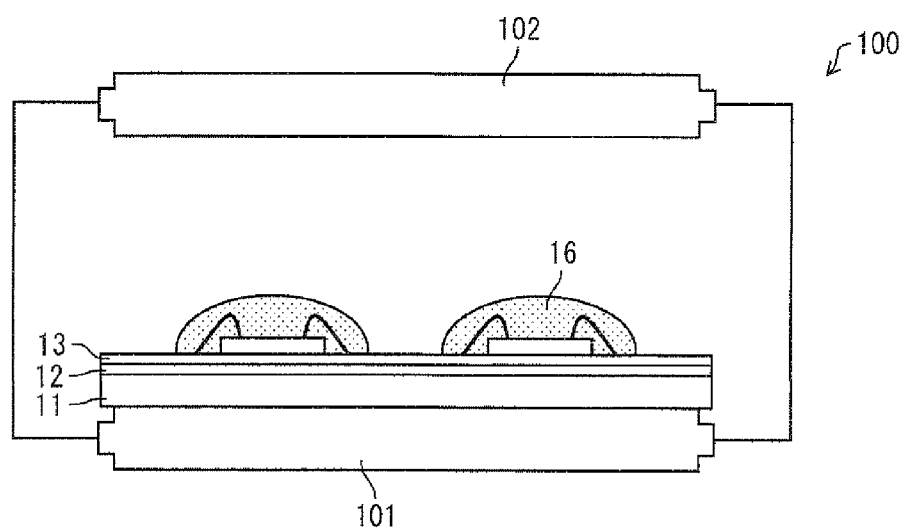
FIG. 9

Next, the fluorine-based water-repellent film 17 is removed as shown in FIG. 9. As a method for removing the fluorine-based water-repellent film 17, the reactive ion etching (RIE) or an isotropic plasma etching (PE) mode can be used for example. The RIE is also used in the aforementioned water-repellent pattern forming step. The isotropic plasma etching (PE) mode uses a radical atmosphere having high reactivity in plasma voltage. FIG. 9 shows a state after the fluorine-based water-repellent film 17 is removed through the RIE. The substrate 11 is taken out from the chamber 100 after the fluorine-based water-repellent film 17 is removed. The light-emitting device 10 in FIG. 1 can be manufactured in this way.

Note that, depending on the circumstances, the fluorine-based water-repellent film (organic film) 17 can be removed by ultraviolet rays (UV) having a wavelength of 184 nm to 254 nm. In this case, the organic film is irradiated with the UV rays for a long time. This irradiation for a long time causes excitation of the substrate 11, resulting in discoloration of the fluorine-based water-repellent film 17. Therefore, such removal with the UV rays needs to be carried out with caution.

As described above, the light-emitting device 10 includes: the substrate 11; the plurality of light-emitting sections provided on the mounting surface of the substrate 11, the plurality of light-emitting sections each including the LED chip 14 and the sealing resin 16 containing fluorescent material; and the alumina insulating film 12 and the silicon oxide insulating film 13 each provided between the substrate 11 and the plurality of light-emitting sections, the alumina insulating film 12 being formed directly on the whole area of the mounting surface of the substrate 11, the silicon oxide insulating film 13 being formed directly on the whole area of the upper surface of the alumina insulating film 12, the sealing resin 16 containing fluorescent material being formed directly on the silicon oxide insulating film 13 so as to cover the LED chips 14.

With this structure, the sealing resin 16 containing fluorescent material is directly formed on the silicon oxide insulating film 13, and the silicon oxide insulating film 13 is directly formed on the alumina insulating film 12 which is formed directly on the substrate 11. Therefore, as compared with adhesive strength between the sealing resin 16 containing fluorescent material and the substrate 11 in the case of forming the sealing resin 16 containing fluorescent material directly on the substrate 11 as in a conventional product, each of (i) adhesive strength between the substrate 11 and the alumina insulating film 12, (ii) adhesive strength between the alumina insulating film 12 and the silicon oxide insulating film 13, and (iii) adhesive strength between the silicon oxide insulating film 13 and the sealing resin 16 containing fluorescent material is higher. This makes it possible to enhance adhesiveness of the sealing resin 16 containing fluorescent material with respect to the substrate 11. Accordingly, the sealing resin 16 containing fluorescent material is hardly separated even if external stress is applied to the sealing resin 16 containing fluorescent material. The light-emitting device 10 has excellent adhesiveness between the sealing resin 16 containing fluorescent material and the lower layer.

Further, according to the light-emitting device 10, the sealing resin 16 containing fluorescent material is formed with use of the fluorine-based water-repellent film 17. This method for forming the sealing resin 16 containing fluorescent material does not need any molds, and therefore can achieve reduction in cost.

Furthermore, the sealing resin 16 containing fluorescent material can be formed in a state in which the substrate 11 is placed on a lower side (in other words, a state in which the mounting surface of the substrate 11 faces an upper side). In this state, the fluorescent material in the resin is sedimented by gravity toward the LED chip 14 due to a reduction in the viscosity of the resin which reduction is caused by a temperature increase occurred during the curing of the sealing resin 16 containing fluorescent material. Consequently, the fluorescent material is positioned so as to cover each LED chip 14. This enhances wavelength conversion efficiency of the fluorescent material, whereby a desired wavelength spectrum can be obtained even if a content of the fluorescent material is small. Further, change in the wavelength spectrum, i.e., color caused by a direction can be also prevented.

In the light-emitting device 10, the silicon oxide insulating film 13 is formed on the whole area of the upper surface of the alumina insulating film 12, but an area to be covered with the silicon oxide insulating film 13 is not limited thereto. The silicon oxide insulating film 13 only needs to be formed (be deposited) on at least an area of the upper surface of the alumina insulating film 12 on which area the light-emitting sections are mounted (area on which the sealing resin 16 containing fluorescent material is formed). However, forming the silicon oxide insulating film 13 on the whole area of the upper surface of the alumina insulating film 12 is easier than forming the silicon oxide insulating film 13 partially on the upper surface thereof. Even if the silicon oxide insulating film 13 is selectively formed, substantially the same aforementioned effect of improvement in the adhesiveness of the sealing resin 16 containing fluorescent material with respect to the substrate 11 can be obtained as with the case where the silicon oxide insulating film 13 is formed on the whole area thereof.

Further, in the case where the silicon oxide insulating film 13 is partially formed in the aforementioned way, the fluorine-based water-repellent film 17 is partially formed on the alumina insulating film 12 because the alumina insulating film 12 is formed on the whole area of the mounting surface of the substrate 11 aforementioned. Therefore, it is possible to prevent, by the alumina insulating film 12, reduction in water-repellency of the fluorine-based water-repellent film 17 which reduction is caused by effects of the surface state and the material of the substrate 11.

Note that the alumina insulating film 12 is not always needed for the light-emitting device 10. Namely, since the alumina insulating film 12 is the adjusting film as described above, whether the alumina insulating film 12 is necessary or not depends on which material is used for the substrate 11. Instead of providing the alumina insulating film 12, adjustment for preventing the reduction in water-repellency of the fluorine-based water-repellent film 17 can be performed by changing a depositing condition of the fluorine-based water-repellent film 17 or by modifying the material of the substrate 11.

Even if the alumina insulating film 12 is not formed, the sealing resin 16 containing fluorescent material is formed directly on the silicon oxide insulating film 13 which is formed directly on the substrate 11. Therefore, as compared with the adhesive strength between the sealing resin 16 containing fluorescent material and the substrate 11 in the case of forming the sealing resin 16 containing fluorescent material directly on the substrate 11 as in a conventional product, each of (i) the adhesive strength between the substrate 11 and the silicon oxide insulating film 13 and (ii) the adhesive strength between the silicon oxide insulating film 13 and the sealing resin 16 containing fluorescent material is higher. This makes it possible to enhance the adhesiveness of the sealing resin 16 containing fluorescent material with respect to the substrate 11. Accordingly, the sealing resin 16 containing fluorescent material is hardly separated even if external stress is applied to the sealing resin 16 containing fluorescent material.

Further, the LED chips 14 are sealed with the sealing resin 16 containing fluorescent material in the light-emitting device 10, however, the LED chips 14 may be sealed with a transparent resin containing no fluorescent material instead. A color of light emitted from the LED chips 14, the presence or absence of the fluorescent material, and a type of the fluorescent material can be selected in order that the light-emitting device 10 emits light having a predetermined color (chromaticity).

Further, the LED chips 14 are connected to the substrate 11 by the wire bonding in this embodiment, but a flip-chip bonding can be employed instead. The wire bonding has the following features: The gold wire (wire) can be bonded at low cost by a known technique with known equipment. However, luminous flux is sometimes reduced because the gold wire and an area on which the gold wire is bonded cast a shadow on each LED chip 14. Meanwhile, the flip-chip bonding has the following features: Investments in plant and equipment are required because existing equipment cannot be used, which leads to increase in cost. However, since there is no gold wires blocking off the light emitted from the LED chips unlike the wire bonding, the luminous flux increases.

In the light-emitting device 10, one LED chip 14 and the sealing resin 16 containing fluorescent material covering the LED chip 14 form one light-emitting section, but the present invention is not limited thereto, and a plurality of LED chips 14 may be included in one light-emitting section. That is, the plurality of the LED chips 14 and the sealing resin 16 containing fluorescent material collectively covering the plurality of the LED chips 14 can form a light-emitting section.

Figure 10:
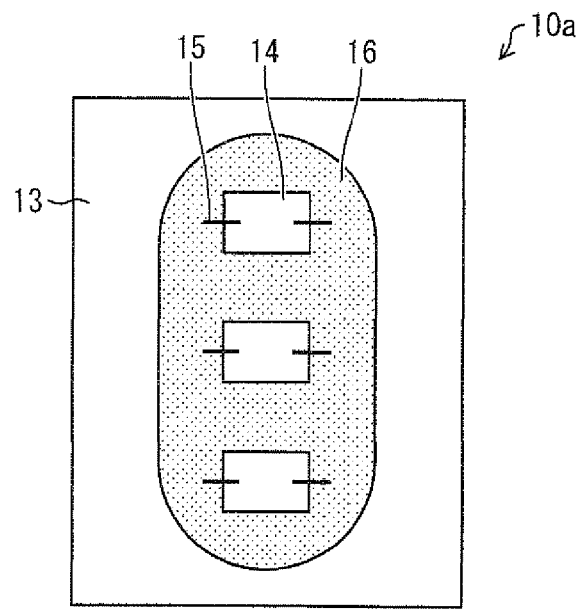
FIG. 10
Figure 11:
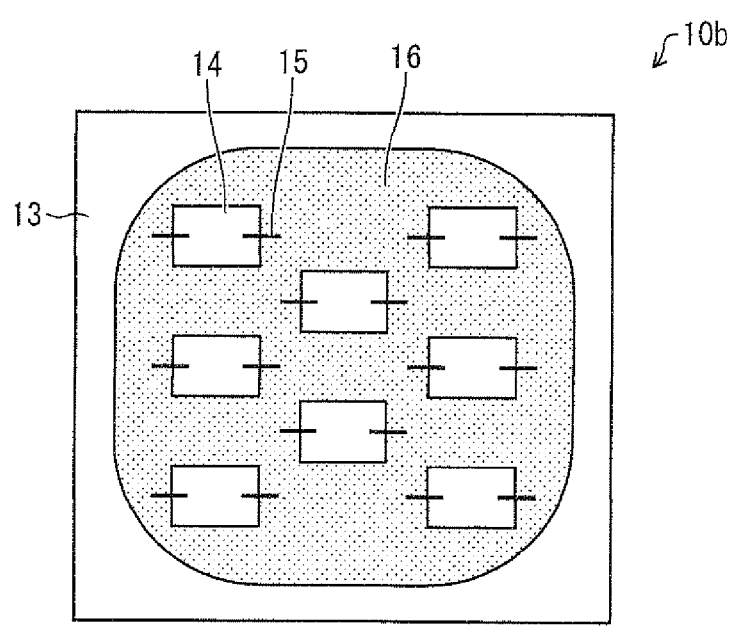
FIG. 11

Examples of a light-emitting device including such the light-emitting section are shown in FIG. 10 and FIG. 11. FIG. 10 shows a light-emitting device 10a configured to include a substrate 11 and a light-emitting section which is provided on a mounting surface of the substrate 11 and includes three LED chips 14 and a sealing resin 16 containing fluorescent material collectively covering the three LED chips 14. FIG. 11 shows a light-emitting device 10b configured to include a substrate 11 and one light-emitting section which is provided on a mounting surface of the substrate 11 and includes eight LED chips 14 and a sealing resin 16 containing fluorescent material collectively covering the eight LED chips 14.

The LED chips 14 are aligned in the light-emitting devices 10a and 10b, but the LED chips 14 does not need to be aligned, and the numbers of the LED chips 14 are not limited to those of FIG. 10 and FIG. 11. For example, the LED chips 14 each having a package size within the range from 400 μm (length)×250 μm (width)×30 μm (height) to 1000 μm (length)×1000 μm (width)×85 μm (height) can be used in the case where one to five LED chip(s) 14 is (are) placed within the sealing resin 16 containing fluorescent material. Further, the plurality of light-emitting sections may be mounted. As described above, the number of the light-emitting sections are determined in accordance with, for example, the light intensity that is set to the light-emitting device.

The sealing resins 16 containing fluorescent material are formed by the method using the fluorine-based water-repellent film 17 in the light-emitting device 10 as described above. However, any method can be used as a method for forming the sealing resins 16 containing fluorescent material as long as the light-emitting device prevents the sealing resin from being peeled easily. That is, a light-emitting device 10' (not shown) including a sealing resin 16 containing fluorescent material formed by a method using, for example, a dam sheet or by compression molding also includes the silicon oxide insulating film 13. Therefore, adhesiveness of the sealing resin 16 containing fluorescent material can be improved. Hence, the sealing resin 16 containing fluorescent material is difficult to be peeled.

For reference, in the case where the sealing resin containing fluorescent material is formed into a circle in a plan view, the sealing resin 16 containing fluorescent material, which is formed by using the fluorine-based water-repellent film 17, has a hemispherical shape, whereas the sealing resin 16 containing fluorescent material, which is formed by using the dam sheet, has a cylindrical shape with its upper surface being substantially flat. Thus, the sealing resin 16 containing fluorescent material and the sealing resin 16 containing fluorescent material are different from each other in their appearances.

Note that, as described above, the method using the fluorine-based water-repellent film 17 provides a more excellent effect than the method using the dam sheet, the compression molding, or the like. Particularly, the method of the aforementioned embodiment for manufacturing the light-emitting device 10 provides an outstanding effect in a light-emitting device having a so-called dual seal structure in which the LED chip 14 is sealed with two layers of resin aforementioned. This will be described below as another embodiment of the present invention.

[Embodiment 2]

Another embodiment of the present invention will be described below with reference to the drawings. Note that, a structure that is not described in this embodiment is the same as in Embodiment 1. Further, for the sake of easy explanation, members having the like functions as the members in the drawings of Embodiment 1 are denoted by the like symbols and the detailed description thereof is omitted.

Figure 12:
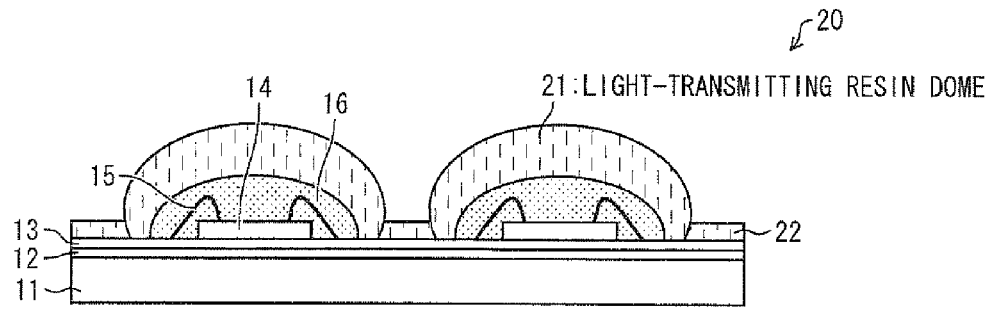
FIG. 12

FIG. 12 is a sectional view of a structural example of a light-emitting device 20 of this embodiment. As shown in FIG. 12, the light-emitting device 20 includes light-transmitting resin domes (second sealing resin) 21 and a light-transmitting resin layer 22 in addition to the structure of the light-emitting device 10 of Embodiment 1. The light-emitting device 20 is a light-emitting device having a so-called dual seal structure in which LED chips 14 are sealed with two layers of resin.

Each of the light-transmitting resin domes 21 and the light-transmitting resin layer 22 is a resin layer made of a resin having light-transmitting properties such as a light-transmitting silicone resin. Each of the light-transmitting resin domes 21 and the light-transmitting resin layer 22 is a sealing resin layer containing no fluorescent material. light-transmitting resin domes 21 are provided to respective their respective LED chips 14, and covers the sealing resin 16 containing fluorescent material covering the LED chip 14. The light-transmitting resin dome 21 has a hemispherical shape (domed shape). The light-transmitting resin layer 22 is formed on a region of the silicon oxide insulating film 13 which region is between the light-transmitting resin domes 21. The light-transmitting resin domes 21 and the light-transmitting resin layer 22 are integrated together (are formed integrally).

(Method for Manufacturing Light-Emitting Device)

A method for manufacturing the light-emitting device 20 having the aforementioned structure will be described below.

Figure 13:
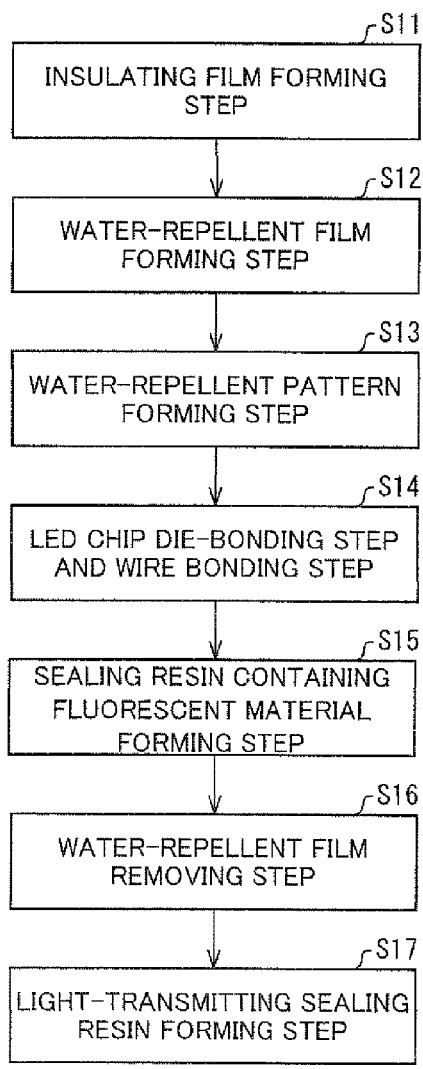
FIG. 13
Figure 14:
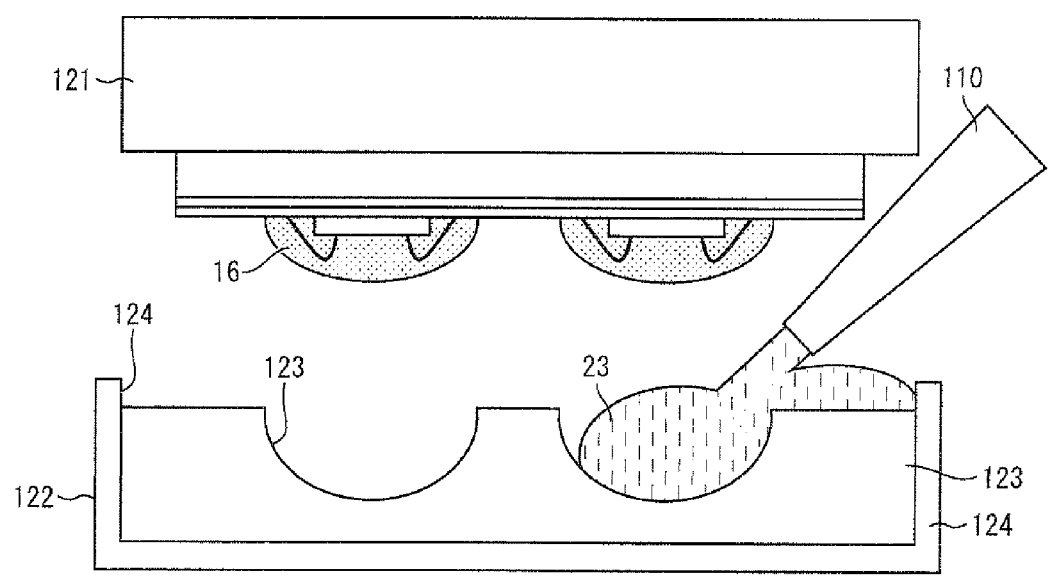
FIG. 14

FIG. 13 is a flow chart of a manufacturing process of the light-emitting device 20. FIG. 14 simply shows a light-transmitting sealing resin forming step of the light-emitting device 20.

The manufacturing process of the light-emitting device 20 includes a light-transmitting sealing resin forming step (step S17) in addition to the manufacturing process of the light-emitting device 10. That is, the manufacturing process of the light-emitting device 20 includes, as shown in FIG. 13, an insulating film forming step (step S11), a water-repellent film forming step (step S12), a water-repellent pattern forming step (step S13), an LED chip die bonding step and a wire bonding step (step S14), a sealing resin containing fluorescent material forming step (step S15), a water-repellent film removing step (step S16), and the light-transmitting sealing resin forming step (step S17). Hereinafter, the light-transmitting sealing resin forming step will be described.

<Step S17: Light-Transmitting Resin Layer Forming Step>

After the water-repellent film removing step (step S16), the light-transmitting resin domes 21 and the light-transmitting resin layer 22 are formed. Specifically, the light-transmitting resin domes 21 and the light-transmitting resin layer 22 are formed by compression molding as shown in FIG. 14.

As shown in FIG. 14, the compression molding uses a mold including a fixed upper-mold 121 and a movable lower-mold 122. The movable lower-mold 122 has hemisphere-shaped (dome-shaped) small cavities (individual cavities) 123 and a large cavity 124. The number and arrangement of the small cavities (individual cavities) 123 correspond to the number and arrangement of the light-emitting sections (LED chips 14 and sealing resin 16 containing fluorescent material) of the light-emitting device 20 to be subjected to the compression molding.

First, in a state in which the movable lower-mold 122 is opened, i.e., is separated from the fixed upper-mold 121, a substrate 11 from which a fluorine-based water-repellent film 17 has been removed is set to a set section of the fixed upper-mold 121 so that a sealing resin 16 containing fluorescent material faces a lower side. That is, a bottom surface of the substrate 11 is set to the set section of the fixed upper-mold 121. Then, a necessary amount of a liquid resin 23, which later becomes the light-transmitting resin domes 21 and the light-transmitting resin layer 22, is injected into the small cavities 123 of the movable lower-mold 122 equally from a dispenser 110. When one small cavity 123 is filled with the liquid resin 23, the liquid resin 23 flows into another small cavity 123 through the large cavity 124. As a result, the liquid resin 23 is distributed uniformly. After the injection, the movable lower-mold 122 is moved toward the fixed upper-mold 121 so that pieces of the sealing resin 16 containing fluorescent material are accommodated in the small cavities 123. Then, the mold is clamped by the fixed upper-mold 121.

Next, by clamping the fixed upper-mold 121 and the movable lower-mold 122 with a predetermined clamping pressure, the liquid resin 23 in the small cavities 123 is compression molded with the sealing resin 16 containing fluorescent material immersed in the liquid resin 23 in the small cavities 123. During the clamping, the large cavity 124 functions as a communicating channel of the liquid resin 23 between the small cavities 123. This makes it possible to effectively prevent differences in amount of the liquid resin 23 between the small cavities 123, thereby distributing the liquid resin 23 equally.

A space created above the large cavity 124 during clamping of the fixed upper-mold 121 and the movable lower-mold 122 is preferably about 50 μm, for example. If this space is too narrow, fluidity of the liquid resin 23 is reduced, and hence the liquid resin 23 cannot flow over the whole substrate 11. As a result, bubbles occur in the liquid resin 23.

Next, this state is maintained at a temperature of 150° C. for about 1 minute, so that the liquid resin 23 is cured. Then, the liquid resin 23 thus cured is subjected to an after-curing under condition of a temperature of 150° C. for 5 hours. Thereafter, the fixed upper-mold 121 and the movable lower-mold 122 are removed. Consequently, (i) the light-transmitting resin domes 21 covering the sealing resin 16 containing fluorescent material and (ii) the light-transmitting resin layer 22 evenly covering the silicon oxide insulating film 13 are formed as shown in FIG. 12. For example, a distance between the substrate 11 and the light-transmitting resin domes 21 is 1.4 mm, whereas a distance between the substrate 11 and the light-transmitting resin layer 22 is 0.05 mm.

As described above, the light-emitting device 20 includes the light-transmitting resin domes 21 covering the sealing resin 16 containing fluorescent material and the light-transmitting resin layer 22 that is formed in an entire space between the light-transmitting resin domes 21.

With this, light emitted from the sealing resin 16 containing fluorescent material can be emitted uniformly through the light-transmitting resin domes 21 and the light-transmitting resin layer 22. This makes it possible to prevent a case where emitted light is shown as bright spots of individual light-emitting sections, and to obtain high luminous efficacy.

Further, the conventional method for manufacturing the light-emitting device having the dual seal structure has the problem of separation of the transparent resin, which problem is caused by forming the upper transparent resin on the water-repellent material. However, according to the manufacturing process of light-emitting device 20, the fluorine-based water-repellent film 17 is removed. Therefore, the light-transmitting resin domes 21 and the light-transmitting resin layer 22 are not formed on the fluorine-based water-repellent film 17, but are formed on the silicon oxide insulating film 13. This allows the light-transmitting resin domes 21 and the light-transmitting resin layer 22 to have excellent adhesiveness. Accordingly, it is possible to reduce the possibility of separation of the light-transmitting resin domes 21 and the light-transmitting resin layer 22 from the substrate even if external stress applies to the light-transmitting resin domes 21.

Note that the light-emitting device 20 does not always need the light-transmitting resin layer 22. Since the light-transmitting resin layer 22 corresponds to a part which functions as the communicating channel during the compression molding as described above, whether the light-transmitting resin layer 22 is necessary for the light-emitting device 20 or not depends on which method is used for forming light-transmitting resin domes 21.

The present invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

A light-emitting device of the present invention includes: a substrate; at least one light-emitting section provided on an upper surface of the substrate, the at least one light-emitting section including at least one light-emitting element, and a first sealing resin covering the at least one light-emitting element; and a silicon oxide insulating film provided between the substrate and the at least one light-emitting section, the silicon oxide insulating film being directly formed on at least an area of the upper surface of the substrate in which area the at least one light-emitting section is provided, the first sealing resin being formed directly on an upper surface of the silicon oxide insulating film so as to cover the at least one light-emitting element.

Further, the silicon oxide insulating film is preferably formed on the whole area of the upper surface of the substrate in the light-emitting device of the present invention. This makes it possible to easily form the silicon oxide insulating film.

A light-emitting device of the present invention includes: a substrate; at least one light-emitting section provided on an upper surface of the substrate, the at least one light-emitting section including at least one light-emitting element, and a first sealing resin covering the at least one light-emitting element; an alumina insulating film provided between the substrate and the at least one light-emitting section; and a silicon oxide insulating film provided between the substrate and the at least one light-emitting section, the alumina insulating film being formed directly on a whole area of the upper surface of the substrate, the silicon oxide insulating film being formed directly on at least an area of an upper surface of the alumina insulating film in which area the at least one light-emitting section is provided, the first sealing resin being formed directly on an upper surface of the silicon oxide insulating film so as to cover the at least one light-emitting element.

Further, in the light-emitting device of the present invention, the silicon oxide insulating film is preferably formed on a whole area of the upper surface of the alumina insulating film. This makes it possible to easily form the silicon oxide insulating film.

Further, in the light-emitting device of the present invention, the silicon oxide insulating film is preferably a silicon oxide film.

Further, in the light-emitting device of the present invention, the at least one light-emitting section further preferably includes a second sealing resin formed directly on the upper surface of the silicon oxide insulating film so as to cover the first sealing resin.

Further, in the light-emitting device of the present invention, the first sealing resin preferably contains a fluorescent material; and the fluorescent material is sedimented toward the substrate.

With this structure, the fluorescent material is placed so as to cover the light-emitting element. This enhances wavelength conversion efficiency of the fluorescent material, whereby a desired wavelength spectrum can be obtained even if a content of the fluorescent material is small. Further, change in the wavelength spectrum caused by a direction, in other words, change in color can be also prevented.

Further, in the light-emitting device of the present invention, the first sealing resin preferably contains a fluorescent material; the fluorescent material is preferably sedimented toward the substrate; and the second sealing resin does not contain the fluorescent material.

With this structure, the fluorescent material is placed so as to cover the light-emitting element. This enhances wavelength conversion efficiency of the fluorescent material, whereby a desired wavelength spectrum can be obtained even if a content of the fluorescent material is small. Further, change in the wavelength spectrum caused by a direction, in other words, change in color can be also prevented.

Furthermore, the first sealing resin is covered with the second sealing resin containing no fluorescent material, therefore light emitted from the first sealing resin can be emitted from the second sealing resin uniformly. This makes it possible to obtain high luminous efficacy.

A method for manufacturing a light-emitting device of the present invention including a substrate and at least one light-emitting section provided on an upper surface of the substrate, the at least one light-emitting section including at least one light-emitting element and a first sealing resin covering the at least one light-emitting element, said method comprising the steps of: forming a silicon oxide insulating film directly on at least an area of the upper surface of the substrate in which area the at least one light-emitting section is to be provided, the upper surface having a wiring pattern; forming a water-repellent film on the upper surface of the substrate so as to cover the silicon oxide insulating film; forming an opening in the water-repellent film, for exposing, through the opening, the silicon oxide insulating film formed on the area in which the at least one light-emitting section is to be provided; providing the at least one light-emitting element on the silicon oxide insulating film within the opening; and forming the first sealing resin by injecting a liquid resin into the opening so as to cover the at least one light-emitting element and curing the liquid resin.

Further, a method for manufacturing a light-emitting device of the present invention including a substrate and at least one light-emitting section provided on an upper surface of the substrate, the at least one light-emitting section including at least one light-emitting element and a first sealing resin covering the at least one light-emitting element, said method comprising the steps of: forming an alumina insulating film directly on a whole area of the upper surface of the substrate, the upper surface having a wiring pattern; forming a silicon oxide insulating film directly on at least an area of an upper surface of the alumina insulating film in which area the at least one light-emitting section is to be provided; forming a water-repellent film on the upper surface of the alumina insulating film so as to cover the silicon oxide insulating film; forming an opening in the water-repellent film, for exposing, through the opening, the silicon oxide insulating film formed on the area in which the at least one light-emitting section is to be provided; providing the at least one light-emitting element on the silicon oxide insulating film within the opening; and forming the first sealing resin by injecting a liquid resin into the opening so as to cover the at least one light-emitting element and curing the liquid resin.

Further, the method for manufacturing the light-emitting device of the present invention further includes preferably the steps of, after the step of forming the first sealing resin: removing the water-repellent film; and forming a second sealing resin directly on an upper surface of the silicon oxide insulating film so as to cover the first sealing resin.

According to the above arrangement, the water-repellent film is removed. Therefore, the second sealing resin is not formed on the water-repellent film, but is formed on the upper surface of the silicon oxide insulating film. This allows the second sealing resin to have excellent adhesiveness. Accordingly, it is possible to reduce the possibility of separation of the second sealing resin from the substrate even if external stress applies to the second sealing resin.

Industrial Applicability

The present invention can be favorably used not only in the fields related to a light-emitting device including a light-emitting element which is provided on a substrate and is covered with a sealing resin, but also in the fields related to a method for manufacturing the light-emitting device, particularly, to a method for forming the sealing resin. Furthermore, the present invention can be widely used in the fields related to, e.g., (i) a light-emitting module including a plurality of light-emitting devices and (ii) a display device including the light-emitting module.

Reference Signs List
10, 10a, 10b, 20 light-emitting device
11 substrate
12 alumina insulating film
13 silicon oxide insulating film
14 LED chip (light-emitting element)
15 gold wire
16 sealing resin containing fluorescent material (first sealing resin)
17 fluorine-based water-repellent film (water-repellent film)
18 pattern mask
19 opening
21 light-transmitting resin dome (second sealing resin)
22 light-transmitting resin layer
100 chamber
110 dispenser
121 fixed upper-mold
122 movable lower-mold

The invention claimed is:

1. A method for manufacturing a light-emitting device including a substrate and at least one light-emitting section provided on an upper surface of the substrate, the at least one light-emitting section including at least one light-emitting element and a first sealing resin covering the at least one light-emitting element, said method comprising the steps of:
   forming a silicon oxide insulating film directly on at least an area of the upper surface of the substrate in which area the at least one light-emitting section is to be provided, the upper surface having a wiring pattern;
   forming a water-repellent film on the upper surface of the substrate so as to cover the silicon oxide insulating film;
   forming an opening in the water-repellent film, for exposing, through the opening, the silicon oxide insulating film formed on the area in which the at least one light-emitting section is to be provided;
   providing the at least one light-emitting element on the silicon oxide insulating film within the opening; and
   forming the first sealing resin by injecting a liquid resin into the opening so as to cover the at least one light-emitting element and curing the liquid resin.

2. The method for manufacturing the light-emitting device according to claim 1, further comprising the steps of, after the step of forming the first sealing resin:
   removing the water-repellent film; and
   forming a second sealing resin directly on an upper surface of the silicon oxide insulating film so as to cover the first sealing resin.

3. A method for manufacturing a light-emitting device including a substrate and at least one light-emitting section provided on an upper surface of the substrate, the at least one light-emitting section including at least one light-emitting element and a first sealing resin covering the at least one light-emitting element, said method comprising the steps of:
   forming an alumina insulating film directly on a whole area of the upper surface of the substrate, the upper surface having a wiring pattern;
   forming a silicon oxide insulating film directly on at least an area of an upper surface of the alumina insulating film in which area the at least one light-emitting section is to be provided;

forming a water-repellent film on the upper surface of the alumina insulating film so as to cover the silicon oxide insulating film;

forming an opening in the water-repellent film, for exposing, through the opening, the silicon oxide insulating film formed on the area in which the at least one light-emitting section is to be provided;

providing the at least one light-emitting element on the silicon oxide insulating film within the opening; and forming the first sealing resin by injecting a liquid resin into the opening so as to cover the at least one light-emitting element and curing the liquid resin.

4. The method for manufacturing the light-emitting device according to claim 3, further comprising the steps of, after the step of forming the first sealing resin:

removing the water-repellent film; and forming a second sealing resin directly on an upper surface of the silicon oxide insulating film so as to cover the first sealing resin.

* * * * *